US006626721B1

United States Patent
Van Slyke

(10) Patent No.: US 6,626,721 B1
(45) Date of Patent: Sep. 30, 2003

(54) ORGANIC ELECTROLUMINESCENT DEVICE WITH SUPPLEMENTAL CATHODE BUS CONDUCTOR

(75) Inventor: Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 382 days.

(21) Appl. No.: 09/667,293

(22) Filed: Sep. 22, 2000

(51) Int. Cl.[7] .............................. H01J 9/00; H01J 9/24; H01J 1/62; H01J 63/04
(52) U.S. Cl. .......................... 445/24; 313/504; 313/506
(58) Field of Search ........................... 445/24; 313/498, 313/504–506; 438/29

(56) References Cited

U.S. PATENT DOCUMENTS

| | | | |
|---|---|---|---|
| 5,276,380 A | | 1/1994 | Tang .......................... 313/504 |
| 5,550,066 A | * | 8/1996 | Tang et al. .................... 438/29 |
| 5,701,055 A | | 12/1997 | Nagayama et al. ......... 313/504 |
| 6,037,712 A | * | 3/2000 | Codama et al. ............. 313/498 |
| 6,290,563 B1 | * | 9/2001 | Codama et al. ............... 445/24 |
| 6,348,359 B1 | * | 2/2002 | Van Slyke et al. ........... 438/29 |
| 6,407,408 B1 | * | 6/2002 | Zhou et al. ................... 257/40 |

\* cited by examiner

*Primary Examiner*—Sandra O'Shea
*Assistant Examiner*—Peter Macchiarolo
(74) *Attorney, Agent, or Firm*—Raymond L. Owens

(57) ABSTRACT

Passive matrix pixelated organic electroluminescent (EL) devices are fabricated by using a single mask which defines a deposition zone for depositing an organic EL medium layer and a thin cathode by directing respective vapor streams towards a substrate in the deposition zone. A cathode bus conductor is formed over an electrically insulative base layer and at least one electrically insulative organic cathode bus shadowing structure is formed over the cathode bus conductor for providing electrical contact between a thin cathode and the cathode bus conductor in a position where the organic EL medium layer is spaced from a base of the cathode bus shadowing structure. The electrical contact is achieved by directing an organic EL materials vapor stream towards the substrate in a direction substantially perpendicular to the substrate, and by directing a cathode materials vapor stream towards the substrate under a subtended angle. An inverted organic EL device is fabricated by providing cathodes on a substrate, forming an organic EL medium layer over the cathodes, and forming light-transmissive anodes over the organic EL medium layer with each anode being in electrical contact with an anode bus conductor.

27 Claims, 14 Drawing Sheets

ORGANIC ELECTROLUMINESCENT DEVICE WITH SUPPLEMENTAL CATHODE BUS CONDUCTOR

CROSS REFERENCE TO RELATED APPLICATIONS

Reference is made to commonly assigned U.S. patent application Ser. No. 09/677,953 filed concurrently herewith entitled "Cathode Contact Structures in Organic Electroluminescent Devices" by Van Slyke et al., which is now U.S. Pat. No. 6,348,359 the disclosure of which is incorporated herein by reference.

FIELD OF THE INVENTION

The present invention relates generally to organic electroluminescent (EL) devices and more particularly to organic EL devices having a supplemental cathode bus conductor and contact structures formed over the cathode bus conductor which provide electrical contact between a light-transmissive cathode and the bus conductor.

BACKGROUND OF THE INVENTION

Passive matrix organic EL devices are fabricated by sandwiching organic EL medium layers between patterned anodes and perpendicularly oriented cathodes. In a conventional pixelated passive matrix organic EL device, light-transmissive anodes, for example indium-tin-oxide (ITO) anodes, are formed on a light-transmissive substrate such as, for example, a glass substrate. Organic EL medium layers are deposited over the anodes and the substrate, and a cathode or cathodes are deposited over the EL medium layers.

Such conventional passive matrix organic EL devices are operated by applying an electrical potential (also referred to as a drive voltage) between an individual row (cathode) and an individual column (anode). When the cathode is biased negatively with respect to the anode, light emission results from a pixel defined by an overlap area of the cathode and the anode, and the emitted light reaches an observer through the anode and the substrate.

In order to display a message or an image with the conventional device, all rows (cathodes) must be actuated or addressed individually and within a frame time selected to be shorter than the response of the human visual system, so as to avoid the perception of a flickering display. Each individual row (cathode) is actuated for a fraction of the frame time (1/# of rows). Therefore, the pixels within a row must be operated or driven to provide a brightness of emitted light (luminance) which is a product of the number of cathode rows and an average value of the displayed luminance. Thus, a relatively high instantaneous luminance is required for each pixel in a row which, in turn, requires relatively thick (typically 0.15 to 0.3 micrometer) cathodes in order to conduct the drive current I to and from the cathodes without undue drop in drive voltage along a length dimension of a cathode. Such relatively thick cathodes are optically opaque and, therefore, preclude light emission through such cathodes.

Stated differently, if light emission through cathodes is desired in a passive matrix organic EL device, metallic cathodes must be sufficiently thin to allow for transmission of emitted light. However, as the cathode thickness is reduced, the cathode becomes unsuitable for conducting the required instantaneous drive current I because the resistance R of a cathode row increases with decreasing cathode thickness. Consequently, a voltage drop $\Delta V = I \times R$ along a cathode increases, necessitating undesirably higher applied drive voltages.

Although the drawings shown in plan view depict schematically a passive matrix organic EL device or its precursor having four anodes and four cathodes, it will be appreciated that a relatively large-area high-resolution organic EL display panel will have a large number of cathode rows intersecting a large number of anode columns. In constructing such display panels, the cathode thickness has to be increased still further to conduct the instantaneous drive current I corresponding to the required instantaneous luminance of each pixel in a cathode row. Cathode thickness values of about 1 micrometer may be required to minimize an undesirable voltage drop $\Delta V = I \times R$ along each cathode of resistance R.

To provide effective cathode separation of such relatively thick cathodes requires relatively tall or relatively high cathode separation shadowing structures which are difficult to manufacture. Forming relatively thick cathodes has a further disadvantage in that minor defects in the organic EL medium layer, sandwiched between anodes and cathodes, can cause permanent "shorts" between an anode and a relatively thick cathode. Such "shorts" may be less pronounced and/or self-healing if relatively thin cathodes could be constructed.

SUMMARY OF THE INVENTION

It is therefore an object of the present invention to form a passive matrix pixelated organic EL device having cathodes of a cathode thickness which is too thin to carry a required instantaneous current, and to provide at least one electrical contact between each cathode and a corresponding cathode bus metal layer capable of carrying the required instantaneous current.

It is another object of the present invention to provide a method of making a passive matrix pixelated organic EL device having a cathode bus metal layer and at least one cathode bus shadowing structure formed over the cathode bus metal layer for providing electrical contact between a thin cathode and the cathode bus metal layer.

It is yet another object of the present invention to provide a method of making a passive matrix pixelated organic EL device having a plurality of spaced thin cathodes each of which is in electrical contact with a cathode bus metal layer which is in electrical contact with a cathode connector which extends inwardly from an edge of a device substrate.

It is a further object of the present invention to provide a method of making a passive matrix pixelated organic EL device having a plurality of spaced thin cathodes, each of which is in electrical contact with a cathode bus metal layer and wherein the cathode bus metal layer forms a cathode connector which extends to an edge of a device substrate.

It is another object of the present invention to provide a method of making a passive matrix pixelated organic EL device having a plurality of spaced light-transmissive cathodes, each of which is in electrical contact with a cathode bus metal layer and wherein the cathode bus metal layer forms a cathode connector which extends to an edge of a device substrate.

These and other objects and advantages are achieved in a method of making a passive matrix pixelated organic electroluminescent (EL) device having a thin cathode, comprising the steps of:

a) providing a substrate having a plurality of spaced anodes formed thereon and a plurality of spaced cathode connectors extending inwardly from an edge of the substrate for providing an electrical connection so that a drive voltage can be applied between a selected anode and a selected thin cathode to cause light emission from a pixel of the device formed by the selected anode and the selected cathode;

b) forming a plurality of spaced electrically insulative base layers over the anodes and the substrate which extend in a direction perpendicular to the anodes and over a portion of each of the spaced cathode connectors and forming an opening or a cut-out in the base layers to extend to the cathode connectors in the portion;

c) forming a conductive cathode bus metal layer over a portion of each of the base layers, the bus metal layer extending at least into the opening or cut-out to provide an electrical contact to each of the spaced cathode connectors;

d) forming an electrically insulative organic cathode separation shadowing structure over each of the base layers and forming at least one organic cathode bus shadowing structure over a portion of the cathode bus metal layer;

e) providing a mask defining a deposition zone over the substrate for depositing an organic EL medium layer and a conductive cathode over the organic EL medium layer;

f) first depositing the organic EL medium layer by vapor deposition of organic EL materials directed towards the substrate into the deposition zone and using a direction of vapor deposition of the organic EL materials with respect to the shadowing structures formed in step d) to cause formation of the organic EL medium layer to terminate at positions spaced from a base of each of the shadowing structures; and g) second depositing a conductive thin cathode by a vapor deposition of conductive cathode materials directed towards the organic EL medium layer into the deposition zone and using a direction of vapor deposition of the conductive materials with respect to the shadowing structures formed in step d) to cause formation of a plurality of spaced thin cathodes, each of such spaced cathodes being in electrical contact with a corresponding cathode bus metal layer in the positions where the organic EL medium layer is spaced from the base of the at least one cathode bus shadowing structure.

BRIEF DESCRIPTION OF THE DRAWINGS

FIGS. 1–7 depict schematically aspects of making a prior art pixelated organic electroluminescent (EL) device, in which FIG. 1 is a plan view of a substrate having a plurality of spaced anodes, cathode connectors, and cathode separation shadowing structures which extend in a direction perpendicular to the anodes;

FIG. 2 is a section view of the substrate taken along the section line 2—2 of FIG. 1;

FIG. 3 is a section view of the substrate taken along the section line 3—3 of FIG. 1;

FIG. 4 is a plan view of the substrate which has portions covered by a first mask defining a first deposition zone for depositing an organic EL medium layer on the substrate;

FIG. 5 is an enlarged section view of the substrate taken along the section line 5—5 of FIG. 4 and indicating portions of the organic EL medium layer formed by vapor deposition from a vapor stream which is incident on the substrate in the first deposition zone in a direction substantially perpendicular to the substrate;

FIG. 6 is a plan view of the substrate which has portions covered by a second mask defining a second deposition zone for depositing a conductive cathode over the organic EL medium layer and over portions of the cathode connectors such that the organic EL medium layer will protect the anodes from electrical contact with the cathode;

FIG. 7 is an enlarged section view taken along the section line 7—7 of FIG. 6 and showing a contact region formed between a cathode connector and a cathode, the cathode spaced from adjacent cathodes by the cathode separation shadowing structures which shadow a cathode materials vapor steam incident on the substrate in the second deposition zone in a direction substantially perpendicular to the substrate;

FIGS. 8–15 indicate schematically aspects of making a pixelated organic electroluminescent (EL) device in accordance with the present invention and having on a substrate a plurality of spaced anodes, cathode separation shadowing structures, a cathode bus metal layer having a plurality of cathode bus shadowing structures formed thereover and cathode connectors with each cathode connector in electrical contact with a corresponding cathode bus metal layer, in which FIG. 8 is a plan view of a substrate having a plurality of spaced anodes, cathode separation shadowing structures which extend in a direction perpendicular to the anodes, two boundary layers, and spaced cathode connectors each of which is in electrical contact with a cathode bus metal layer having a plurality of cathode bus shadowing structures formed thereover;

FIG. 9 is an enlarged section view taken along the section line 9—9 of FIG. 8 and showing one of the boundary layers formed over the anodes and the substrate;

FIG. 10 is an enlarged section view taken along the section line 10—10 of FIG. 8 and showing a cathode connector being in electrical contact with the cathode bus metal layer through an opening formed in an electrically insulative base layer;

FIG. 11 is an enlarged section view taken along the section line II—II of FIG. 8 and showing a cathode separation shadowing structure and a cathode bus shadowing structure formed over the cathode bus metal layer;

FIG. 12 is a perspective view of a central portion of the substrate of FIG. 8;

FIG. 13 is a plan view of an organic EL device in which an organic EL medium layer and thin or/and light-transmissive cathodes have been formed over the substrate of FIG. 8 by vapor deposition into a deposition zone defined in a mask;

FIG. 14 is an enlarged section view taken along the section line 14—14 of FIG. 13 and showing a cathode separation shadowing structure in which first (organic EL) and second (cathode) vapor depositions form an organic EL medium layer and a cathode, respectively, and the cathode bus metal layer being in electrical contact with the cathode connector;

FIG. 15 is an enlarged section taken along the section line 15—15 of FIG. 13 and showing a cathode separation shadowing structure and a cathode bus shadowing structure in which first (organic EL) and second (cathode) vapor depositions form an organic EL medium layer and a cathode, respectively, the cathode being in electrical contact with the cathode bus metal layer;

FIGS. 16–18 show schematically aspects of providing a device substrate in accordance with the present invention wherein the cathode bus metal layer has a widened portion extending to an edge of the substrate to function as a cathode connector, thereby obviating cathode connector shadowing structures, in which FIG. 16 is a plan view of a device substrate having a plurality of spaced anodes, cathode separation shadowing structures which extend in a direction perpendicular to the anodes, two boundary layers, and a cathode bus metal layer having a plurality of cathode bus shadowing structures formed thereover, the cathode bus metal layer formed to extend into a widened portion to an edge of the substrate;

FIG. 17 is an enlarged section view taken along the section line 17—17 of FIG. 16 and showing a cathode separation shadowing structure and a cathode bus shadowing structure formed over a cathode bus metal layer;

FIG. 18 is an enlarged section view taken along the section line 18—18 of FIG. 16 and showing a widened portion of the cathode bus metal layer formed over a widened portion of an electrically insulative base layer;

FIGS. 19–21 show schematically aspects of providing a device substrate wherein the plurality of cathode bus shadowing structures are replaced by one elongated cathode bus shadowing structure, in which FIG. 19 is a plan view of a device substrate having features of the substrate of FIG. 16, except that one elongated cathode bus shadowing structure is formed over the cathode bus metal layer;

FIG. 20 is an enlarged section view of the substrate taken along section line 20—20 of FIG. 19 and showing a cathode separation shadowing structure and the one cathode bus shadowing structure formed over the cathode bus metal layer; and FIG. 21 is a perspective view of a portion of the substrate of FIG. 19 showing the widened portions extending to an edge of the substrate.

The drawings are necessarily of a schematic nature since the thicknesses of individual layers are too thin, and thickness differences of the various elements too great to permit depiction to scale or to permit convenient proportionate scaling. The plan views illustrate, for purposes of clarity, a passive matrix substrate or device having only four cathodes and four anodes. Additionally, the drawings show a single organic electroluminescent (EL) medium layer which, in actual practice, can include several layers, for example, organic hole-injecting and hole-transporting layers, an organic light-emitting layer which may emit light of a single color or hue, or which can emit one of red, green, or blue light (R, G, B) by appropriate doping of an organic light-emitting host material with a selected organic luminescent dopant material at selected pixel positions, and an organic electron-transporting layer. The organic electroluminescent medium can also emit white light by appropriate choice of emitting dopants. Alternatively, the organic EL medium layer can include one or more organic polymeric layers capable of light-emission.

The term "cathode" denotes an electrode capable of injecting electrons (negative charge carriers) into an organic EL medium layer, and the term "anode" denotes an electrode capable of injecting holes (positive charge carriers) into an organic EL medium layer. The term "thin cathode" describes a cathode having a thickness which would, in the absence of an electrical contact to a cathode bus metal layer, have an undesirably high resistance and a corresponding undesirably high voltage drop along a cathode length dimension. The term "light-transmissive" describes a substrate, an anode, or a cathode which transmits at least 50 percent of light produced by a pixel or by pixels of an organic EL device.

DETAILED DESCRIPTION OF THE INVENTION

In order to more fully appreciate the invention, aspects of making a prior art pixelated organic electroluminescent (EL) device will be described with reference to FIGS. 1–7.

Figure 1:
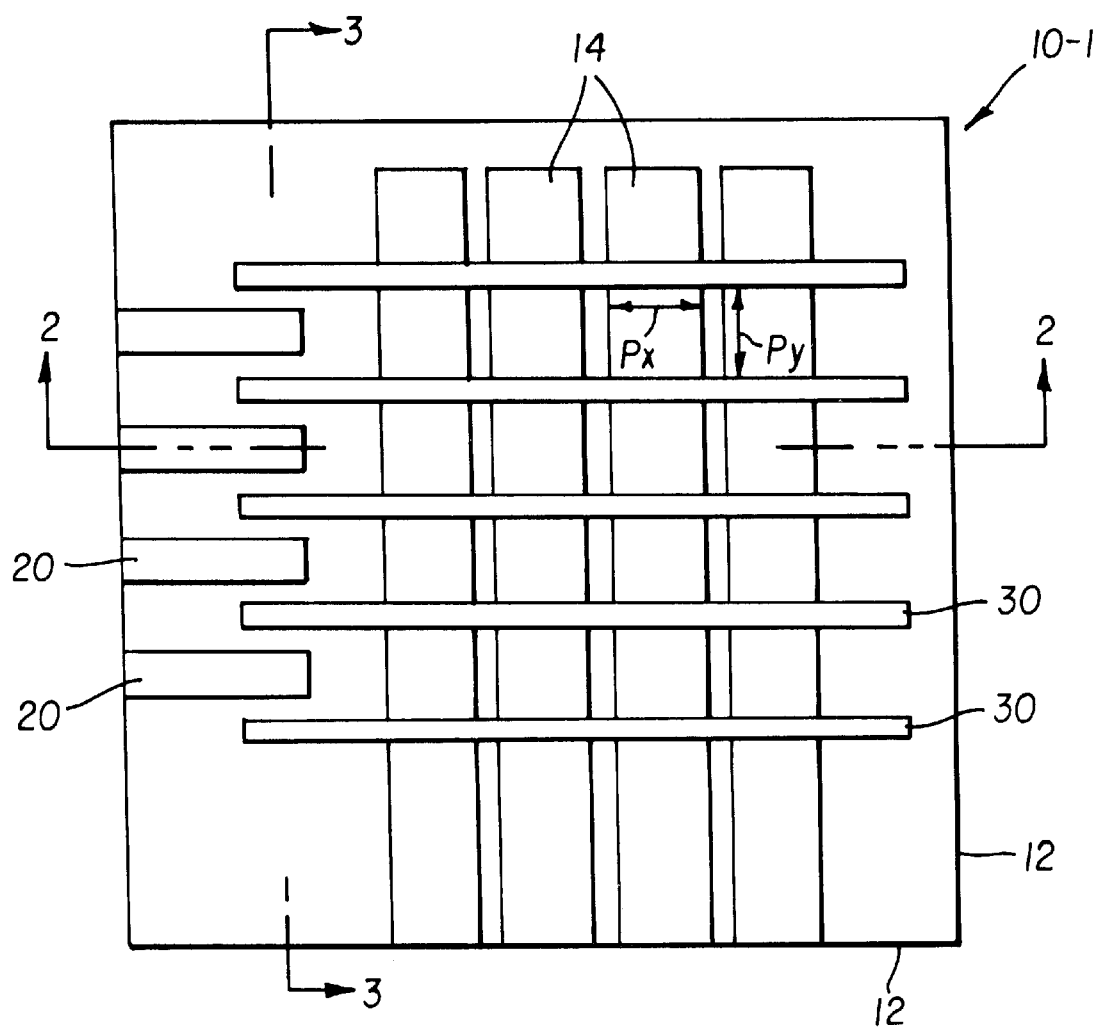

FIG. 1 is a plan view of a substrate configuration 10-1 which includes a light-transmissive substrate 12 having a plurality of spaced light-transmissive anodes 14 formed thereover, as well as a plurality of spaced cathode connectors 20 which extend inwardly from an edge of the substrate. A plurality of organic cathode separation shadowing structures 30 are formed over the anodes and portions of the substrate 12, and extending in a direction perpendicular to the anodes. The cathode separation shadowing structures 30 are electrically insulative, and serve to provide a plurality of spaced cathodes, each of which will be in electrical contact with a cathode connector 20. An active pixel dimension in an x-direction, $P_x$, and an active pixel direction in a y-direction, $P_y$ are indicated in FIG. 1.

The light-transmissive substrate 12 can be made of glass, quartz, suitable plastic materials, and the like. The anodes 14 are preferably made of indium-tin-oxide (ITO), and the cathode connectors 20 are preferably made from a low-resistance metal, for example, copper, aluminum, molybdenum, and the like.

Although not shown in the drawings, it will be understood that each of the anodes 14 can have a low-resistance metal connector pad formed thereover, and extending inwardly from an edge of the substrate 12, for example, from the lower edge depicted in FIG. 1.

Figure 2:
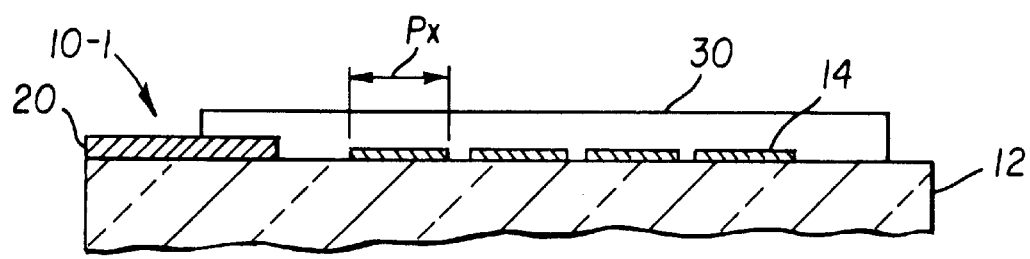

FIG. 2 is a section view of the configuration 10-1, taken along the section line 2—2 of FIG. 1, and showing a cathode separation shadowing structure 30 in the background.

Figure 3:
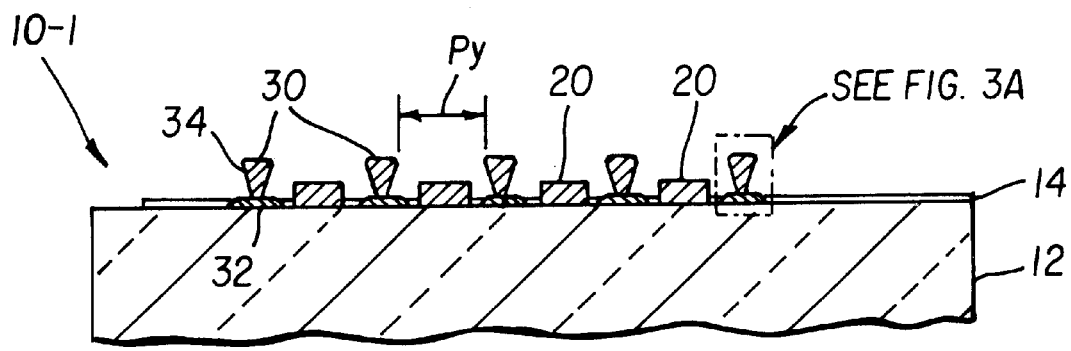

FIG. 3 is a section view of the configuration 10-1, taken along the section line 3—3 of FIG. 1, and showing the cathode connectors 20 positioned between two adjacent cathode separation shadowing structures 30.

Figure 3A:
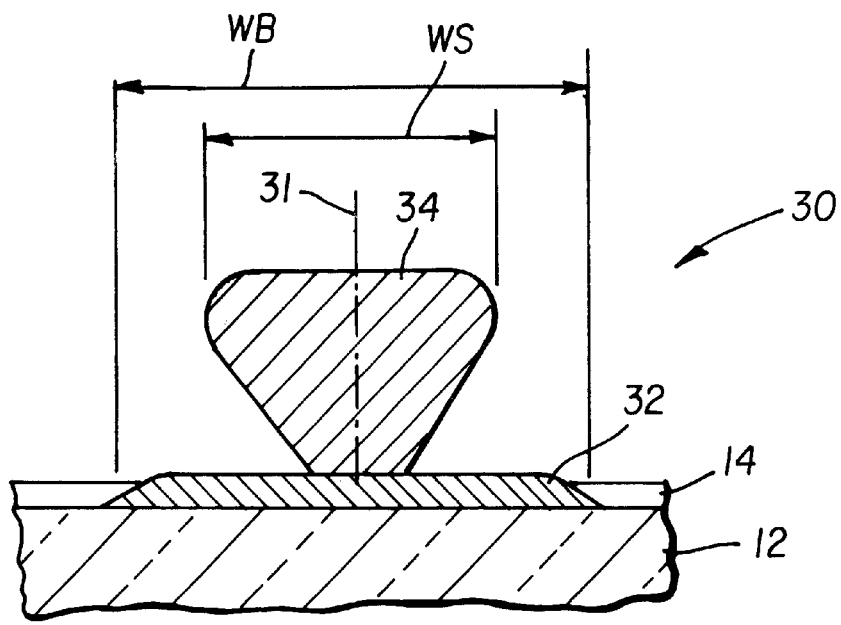
FIG. 3A is an enlarged section view of an organic cathode separation shadowing structure having a base and a shadowing structure over the base.

FIG. 3A is an enlarged section view of one of the cathode separation shadowing structures 30 which includes an electrically insulative base layer 32 and an electrically insulative organic shadowing structure 34 formed over the base layer 32 about a center line 31. A width dimension WB of the base layer 32 is larger than a width dimension WS of the organic shadowing structure 34. The base layer can be formed of an organic material or of an inorganic material such as, for example, glass, silicon dioxide, and the like.

Cathode separation shadowing structures in general have been used in fabricating conventional passive matrix organic EL devices (in the form of integral shadow masks) to provide electrical insulation between adjacent cathodes as disclosed, for example in U.S. Pat. Nos. 5,276,380 and 5,701,055, the disclosures of which are herein incorporated by reference. Organic shadowing structures shown in the drawings of the present application have been described in detail in U.S. patent application Ser. No. 09/372,963, filed Aug. 12, 1999, the disclosure of which is herein incorporated by reference.

Figure 4:
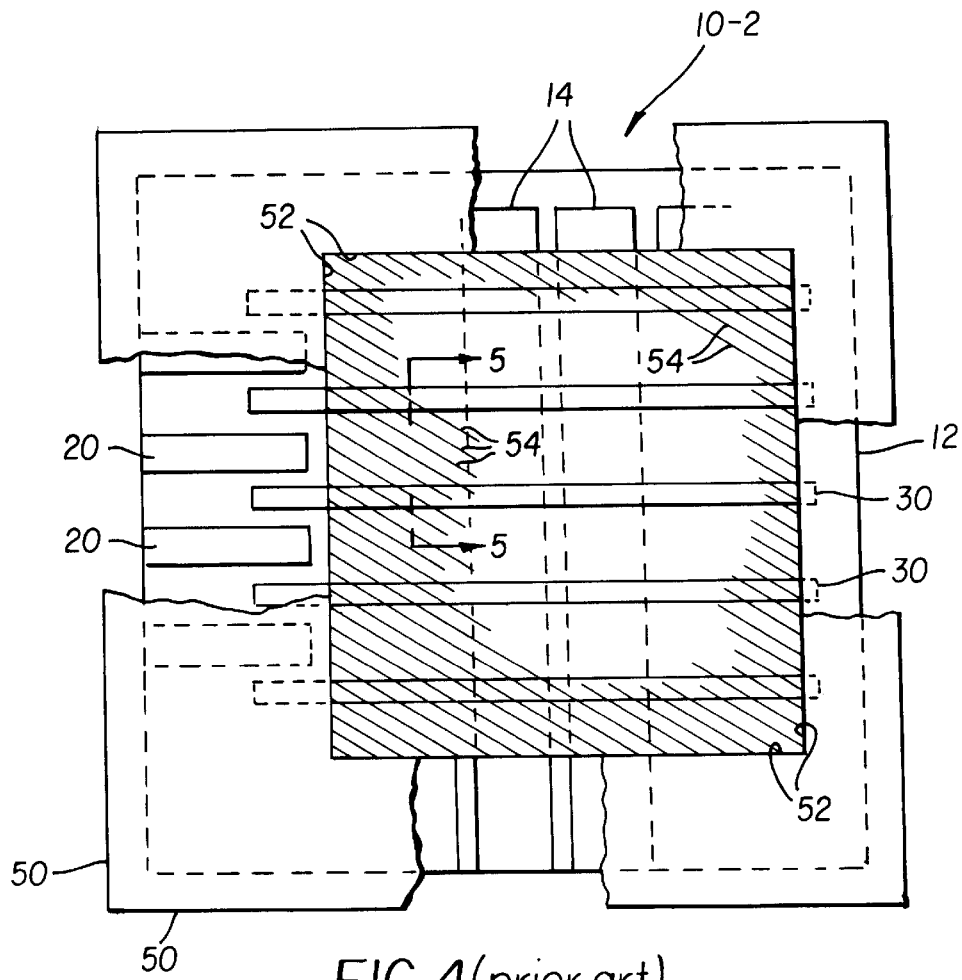

FIG. 4 is a plan view of a configuration 10-2 in which portions of the substrate 12 are covered by a first mask 50 which defines a first deposition zone 52. An organic EL medium layer 54 is formed over the substrate within the deposition zone 52 (for purposes of clarity of presentation, EL medium deposits formed over the mask 50 are not shown). The first mask 50 and its deposition zone 52 was accurately oriented with respect to the substrate 12 outside of an evacuated vapor deposition chamber, i.e. prior to forming the EL medium layer 54 by vapor deposition inside the vapor deposition chamber (not shown).

Figure 5:
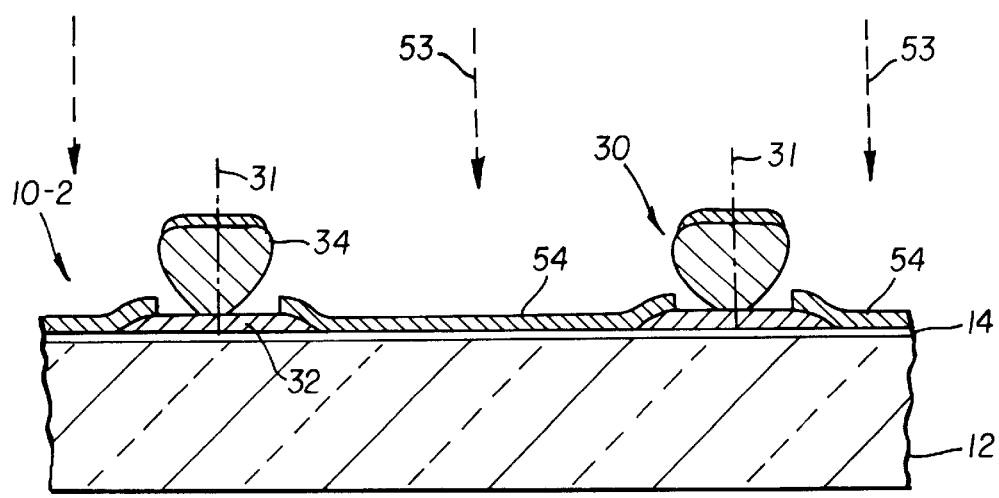

Turning to FIG. 5, there is shown an enlarged section view of the substrate 12 taken along the section line 5—5 of FIG. 4. Portions of the organic EL medium layer 54 are shown formed by vapor deposition from an organic EL materials vapor stream 53 which is directed towards the substrate 12 in the deposition zone 52 in a direction of vapor deposition substantially perpendicular to the substrate (or, alternatively, substantially parallel to the center lines 31 of the cathode separation shadowing structures 30).

Figure 6:
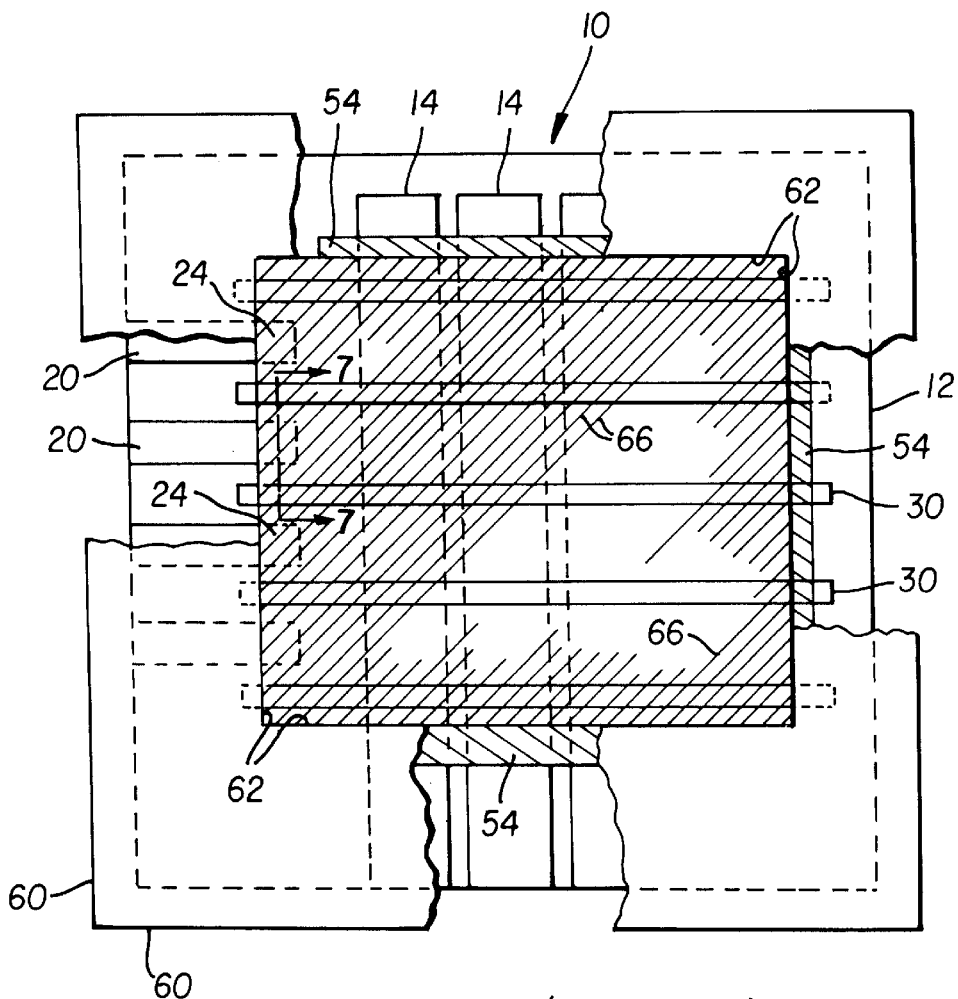

FIG. 6 is a plan view of an organic EL device 10 in which the substrate 12 has portions covered by a second mask 60 which defines a second deposition zone 62 for vapor depositing a conductive cathode 66 over the organic EL medium layer 54 and which is offset with respect thereto to provide contact regions 24 between the cathodes (separated from one another by the organic cathode separation shadowing structures 30) and the cathode connectors 20.

It will be appreciated that, prior to forming the cathode(s) 66, the first mask 50 (see FIG. 4) had to be separated from the substrate 12 inside the vacuum deposition chamber, and the second mask 60 had to be manipulated into a best-possible alignment with respect to the previously formed organic EL medium layer 54, also inside the deposition chamber.

Figure 7:
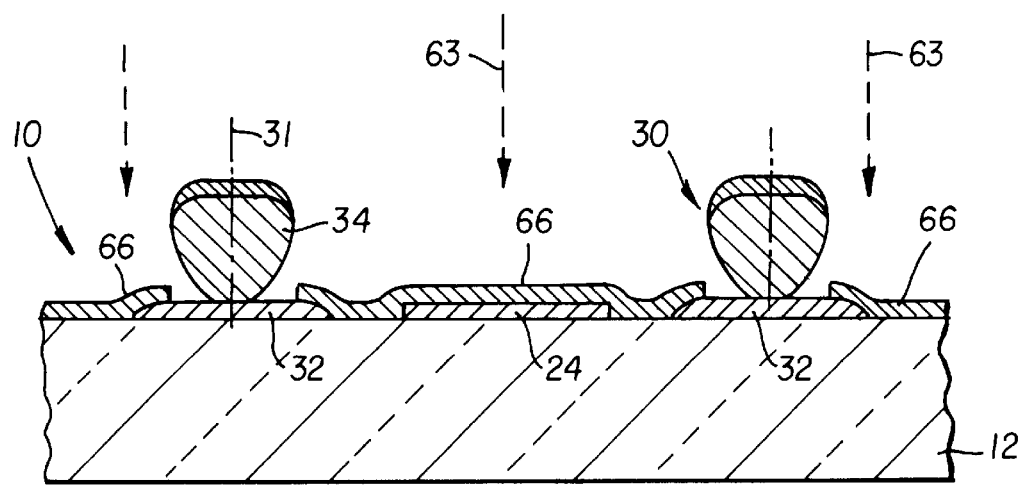

FIG. 7 is an enlarged section view taken along the section line 7—7 of FIG. 6 and showing a contact region 24 between a portion of a cathode connector 20 and the cathode 66. Adjacent cathodes 66 are spaced from one another by the cathode separation shadowing structures 30 as the cathodes 66 are formed from a cathode material vapor stream 63 which is directed toward the substrate into the deposition zone 62 in a direction substantially perpendicular to the substrate (or substantially parallel with the center lines 31 of the shadowing structures).

As shown in FIGS. 5 and 7, both the organic EL medium layer 54 and the cathode(s) 66 terminate on the base layer 32 at a position which is spaced from a base of the shadowing structures 34 due to the shadowing effect of such structures when the vapor streams 53 and 63 are directed at the substrate in the deposition zones 52 and 62 as indicated in FIGS. 5 and 7.

Upon removal of the mask 60 from the device 10 of FIG. 6, the passive matrix organic EL device 10 is operated by applying an electrical potential between a selected cathode via a cathode connector and a selected anode. When the selected cathode is biased negatively with respect to the selected anode, a selected pixel, $P_x$ $P_y$, will emit light through the light-transmissive anode 14 and the light-transmissive substrate 12.

Figure 8:
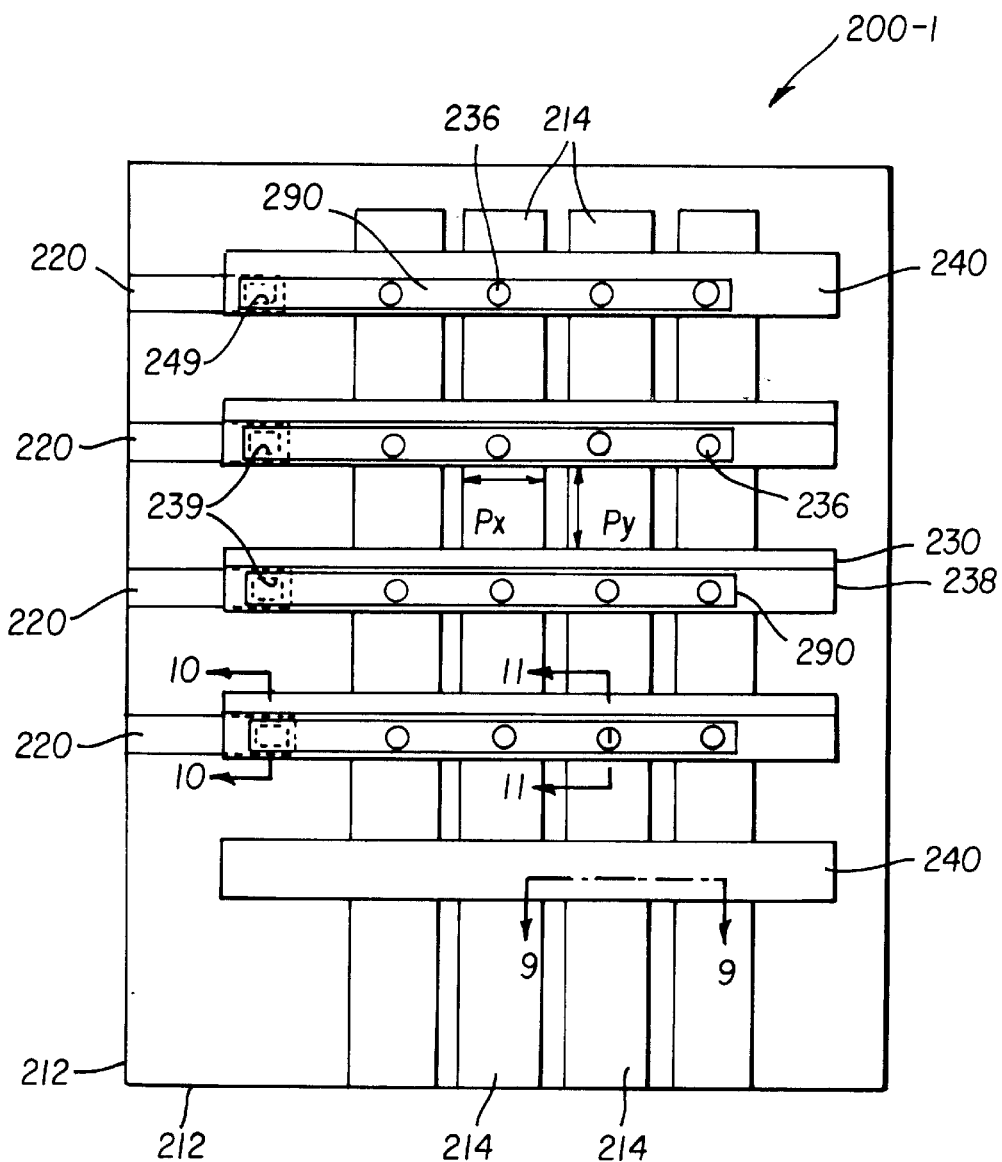

FIG. 8 is a plan view of a substrate configuration 200-1 before deposition of an organic EL medium layer. The substrate 212 can be an opaque substrate such as, for example, an opaque plastic substrate or a ceramic substrate. Alternatively, the substrate 212 can be a light-transmissive substrate. A plurality of spaced anodes 214 are formed over the substrate. The anodes are preferably formed of a material having a work function greater than 4.0 eV, for example, tin oxide, indium-tin oxide (ITO), gold, silver, copper, platinum, or tantalum. Optically opaque anodes are used only if light can be emitted from a device through light-transmissive cathodes. In that configuration, such anodes are preferably optically reflective at a wavelength range of light emission of a completed organic EL device. Electrically conductive cathode connectors 220 extend inwardly from an edge of the substrate 212 for electrical connection of each of a plurality of spaced cathodes to a drive voltage generator.

Electrically insulative base layers are now formed over the anodes 214 and over the substrate by photolithographic process steps well known to those skilled in the art of patterning photoresist layers by photolithography, and as described in the aforementioned U.S. patent application Ser. No. 09/372,963. In particular, electrically insulative boundary layers 240 and base layers 238 are formed initially to extend in a direction perpendicular to the anodes 214.

Electrically insulative boundary layers 240 and electrically insulative base layers 238 can be formed of inorganic material such as, for example, glass, silicon dioxide, or a silicon oxinitride. Such inorganic layers can be patterned by deposition through a patterned mask. Alternatively, such inorganic layers can be patterned by photolithographic process steps which include etching processes well known to those skilled in the art of photolithographic patterning procedures. Alternatively, electrically insulative boundary layers 240 and electrically insulative base layers 238 can be formed of organic materials such as, for example, conventional positive-working or conventional negative-working photoresist materials which can be patterned by a patternwise exposure to activating radiation, followed by pattern development steps equally well established in the field known as "photolithography."

Together with forming the boundary layers 240 and the base layers 238, an opening 249 is created in one of the boundary layers 240 (shown in the uppermost location in FIG. 8), and an opening 239 is formed in each of the base layers 238. These openings extend through the respective layers to the cathode connectors 220.

A cathode bus metal layer 290 is formed over a portion of one of the boundary layers 240 and over a portion of each of the base layers 238. The cathode bus metal layer provides an electrical contact to a corresponding cathode connector 220 through the respective openings 239 and 249. The cathode bus metal layer(s) can be made of a conductive metal, for example, of chromium, copper, silver, molybdenum-tantalum, platinum, or the like, thus providing a low resistance along a length dimension and a correspondingly low voltage drop. A low resistance electrical contact is provided between each bus metal layer 290 and a corresponding cathode connector 220 via the openings 239, 249 in the electrically insulative base layers 238 and the boundary layer 240. The cathode bus metal layers can be patterned by the aforementioned direct-deposition or photolithography processing steps.

An organic cathode separation shadowing structure 230 is formed over each of the base layers 238 in a portion thereof which is not covered by the cathode bus metal layer 290. A plurality of cathode bus shadowing structures 236 are formed at the same time over each of the cathode bus metal layers 290.

Figure 9:
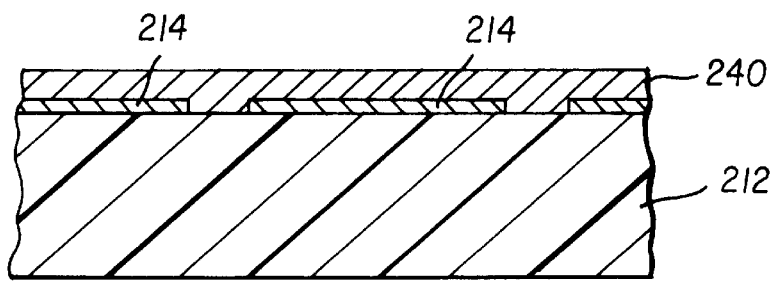

FIG. 9 is an enlarged section view taken along the section line 9—9 of FIG. 8 and showing portions of the anodes 214 and the electrically insulative organic boundary layer 240.

Figure 10:
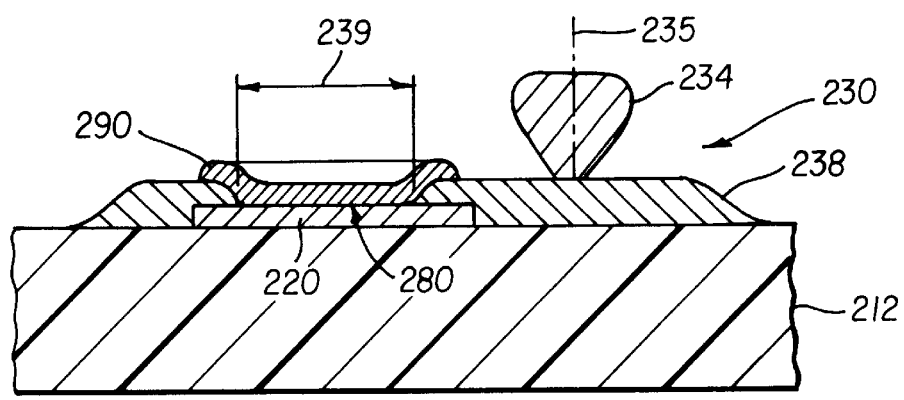

FIG. 10 is an enlarged section view taken along the section line 10—10 of FIG. 8, and showing the electrically insulative organic base layer 238 having an organic shadowing structure 234 formed over a portion of the base layer 238. The shadowing structure 234 has a center line 235, and comprises in conjunction with the base layer 238 the organic cathode separation shadowing structure 230. The cathode bus metal layer 290 is in electrical contact with the cathode connector 220, via the opening 239 in the base layer 238. This electrical contact region is indicated at 280.

Figure 10A:
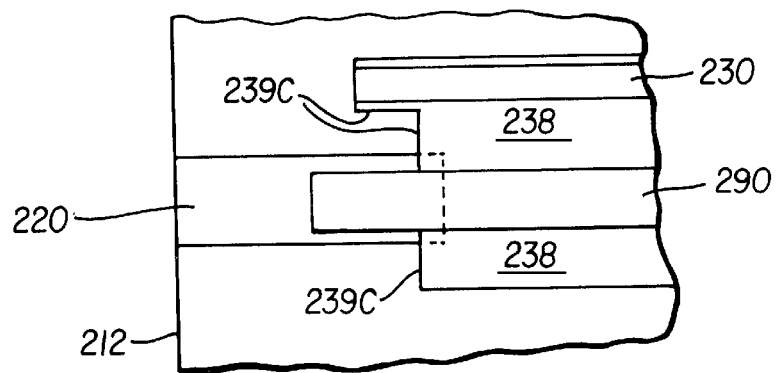
FIG. 10A is an enlarged partial plan view showing a cathode connector being in electrical contact with a cathode bus metal layer at a cut-out portion formed in an electrically insulative base layer to provide an alternative electrical contact.

FIG. 10A is an enlarged partial plan view of a substrate configuration which shows an alternative approach to providing an electrical contact between a cathode bus metal layer 290 and a cathode connector 220. Here, a cut-out portion 239C in the base layer 238 is formed instead of the previously described opening 239. The cathode bus metal layer 290 extends into this cut-out portion and provides the electrical contact therein to the cathode connector 220.

Figure 11:
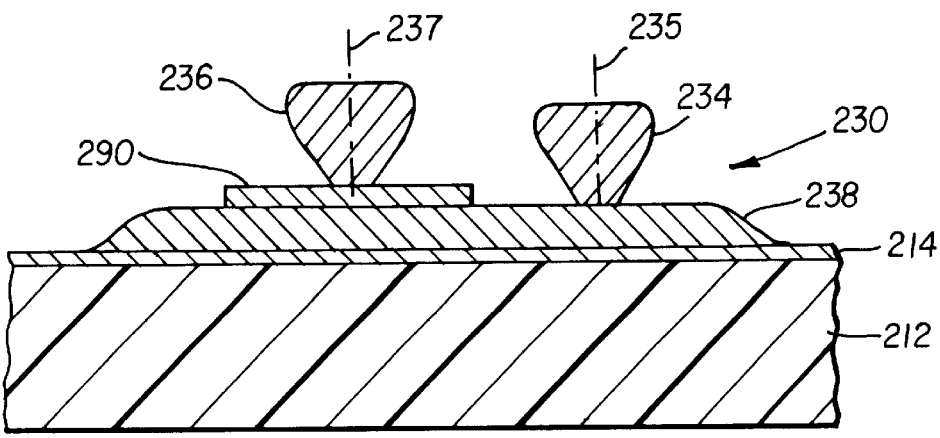

FIG. 11 is an enlarged section view taken along the section line II—II of FIG. 8, and showing an anode 214, the electrically insulative organic base layer 238, the shadowing structure 234, and the cathode bus metal layer 290 over which has been formed the organic cathode bus shadowing structure 236 having a center line 237.

Figure 12:
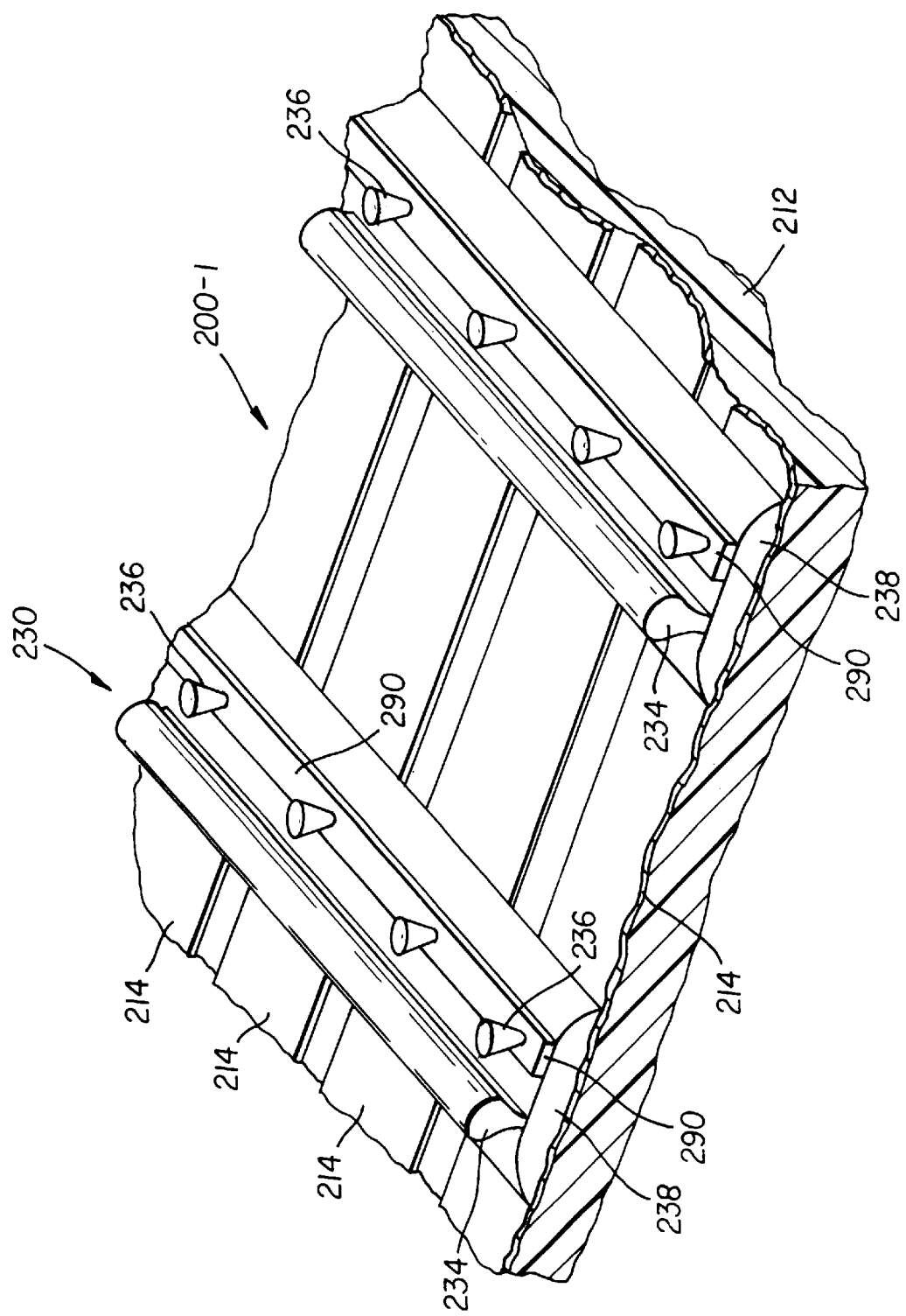

FIG. 12 is a schematic perspective view of a central portion of the substrate configuration 200-1 of FIG. 8. While the cathode bus shadowing structures 236 are depicted for illustrative purposes only as having a circular shape as observed in a plan view for such structures, it will be appreciated that such shadowing structures can have a polygonal shape, such as, for example, a square shape (see FIG. 16) or a hexagonal shape.

Figure 13:
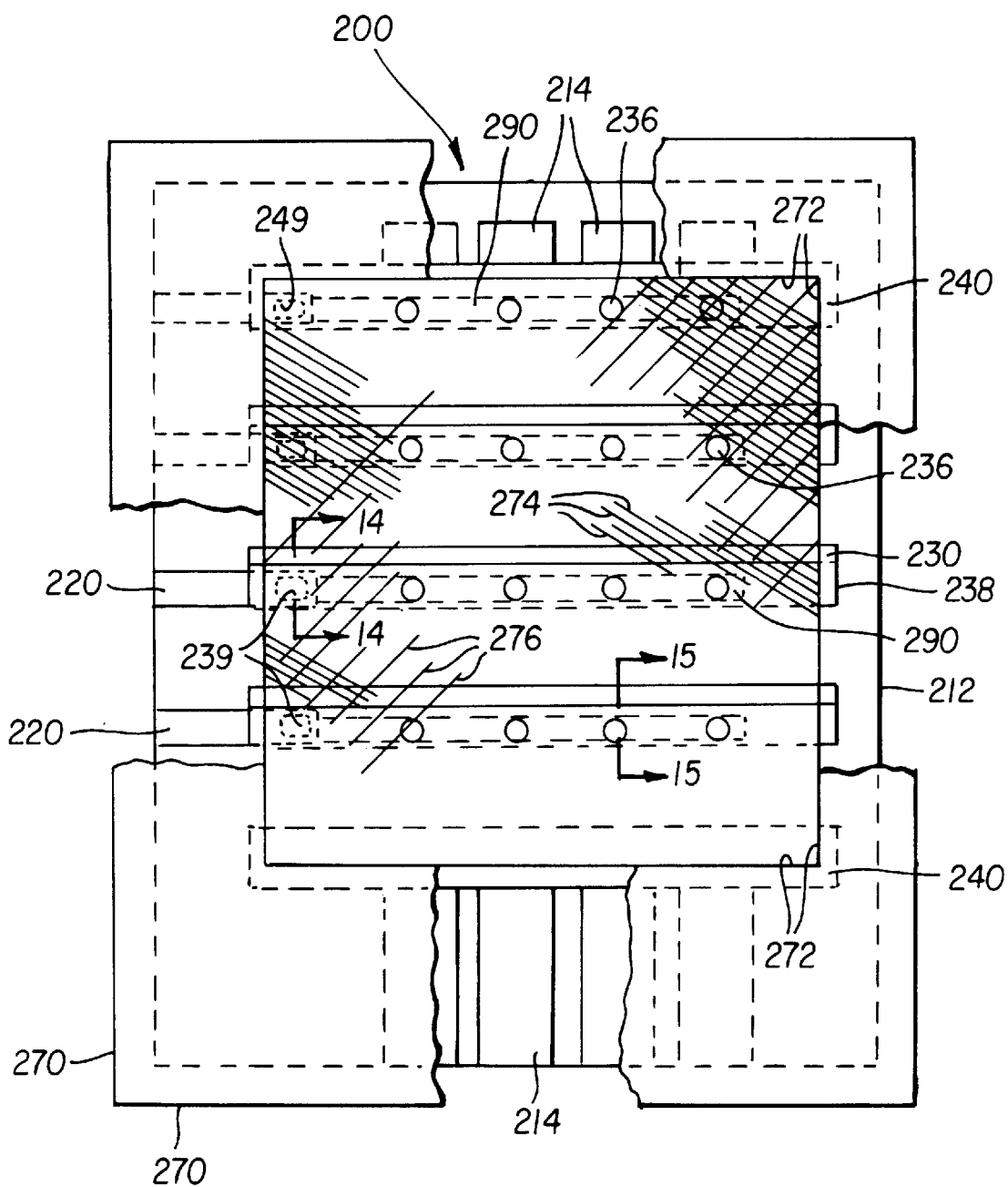

FIG. 13 is a plan view of a completed organic EL device 200, following formation of an organic EL medium layer 274 and of cathode(s) 276 over the organic EL medium layer 274 by vapor deposition directed towards the substrate 212 into a deposition zone 272 which is defined in a mask 270. The mask 270 masks portions of the cathode connectors 220 and portions of the anodes 214 from deposition. For purposes of clarity, deposits formed over the mask 270 are not shown in FIG. 13.

Vapor deposition of the organic EL medium layer 274 and of the cathode(s) 276 will now be described with reference to FIGS. 14 and 15, which are enlarged section views taken along section lines 14—14 and 15—15, respectively, of FIG. 13.

Figure 14:
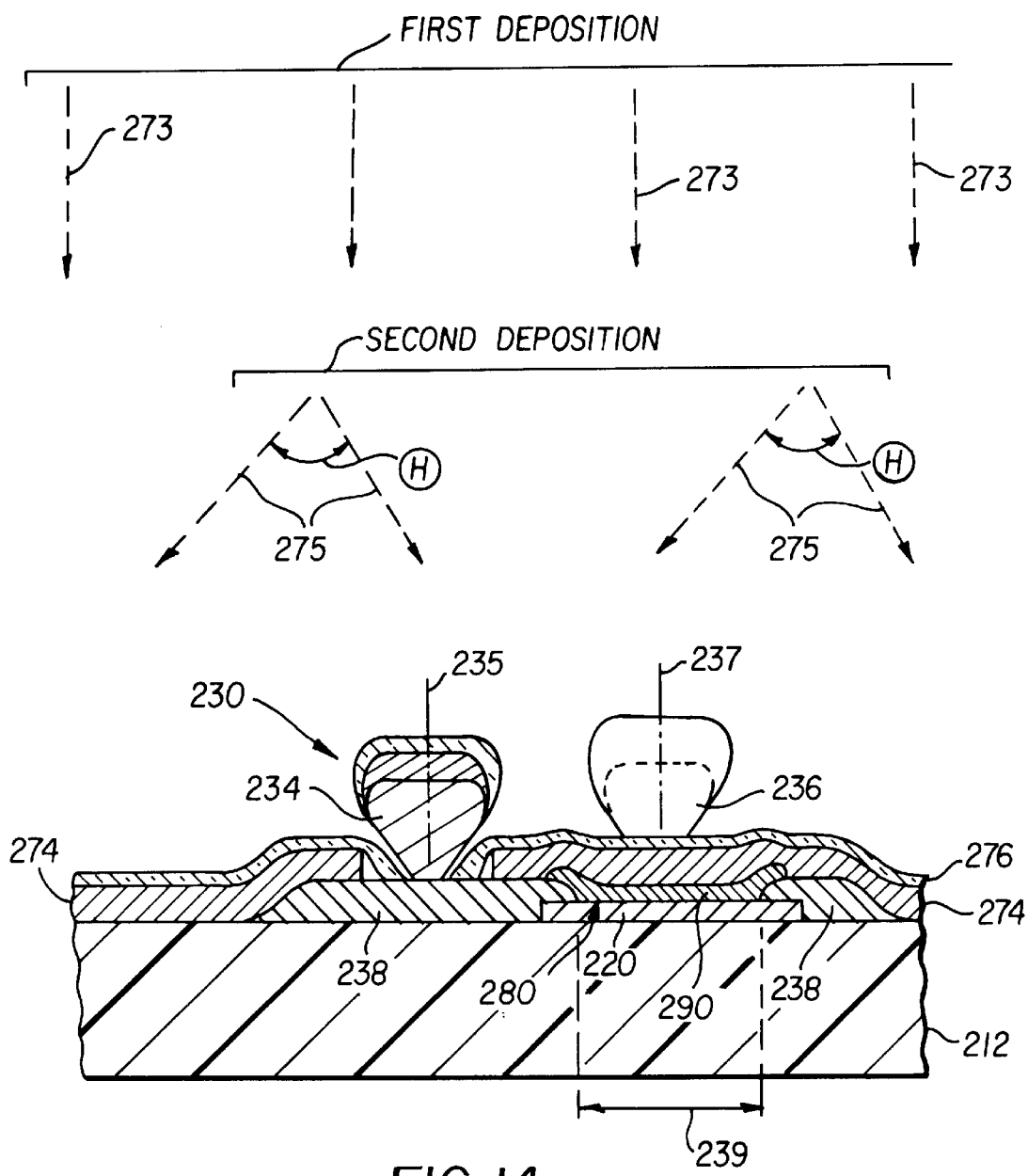
Figure 15:
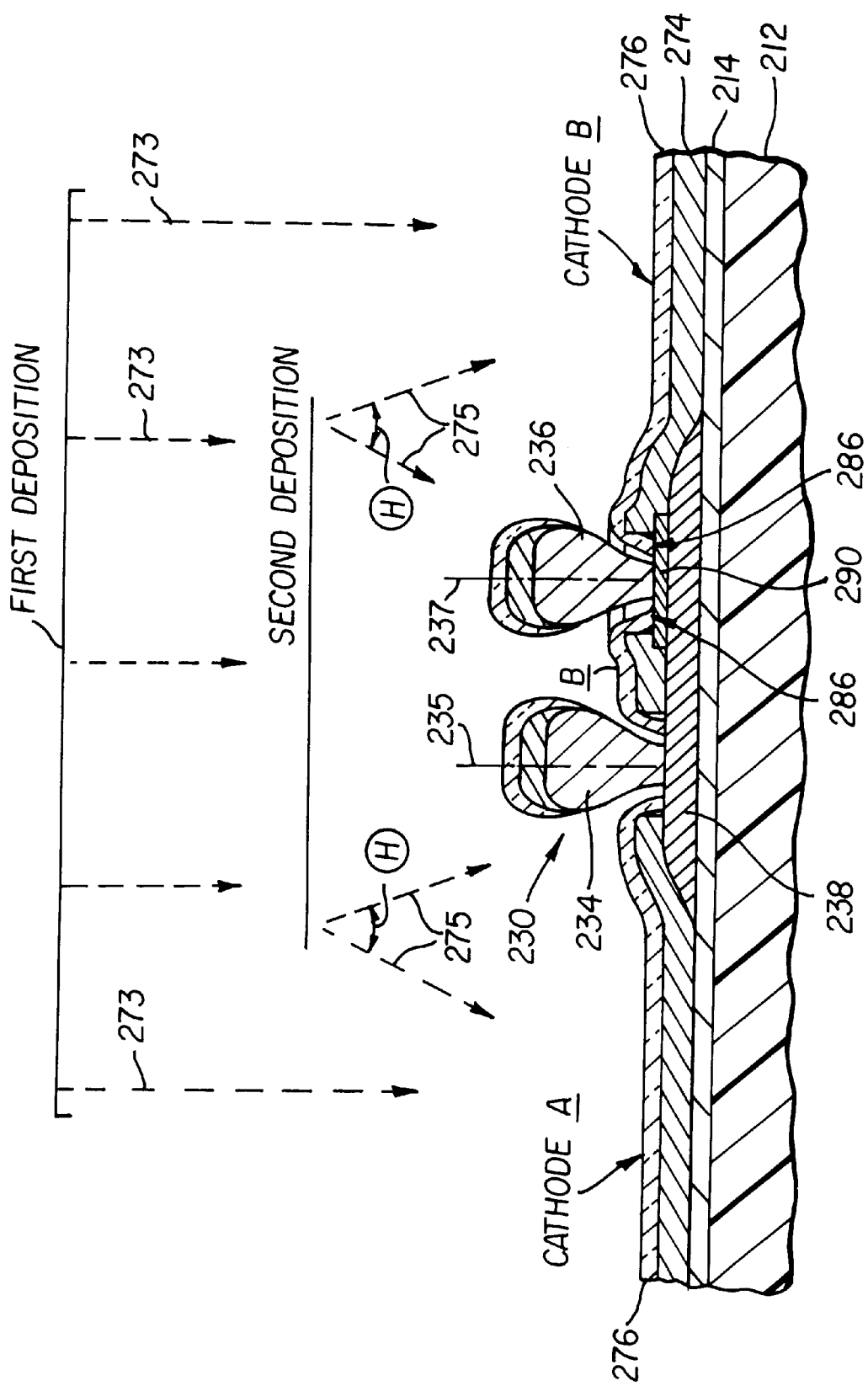

Viewing FIGS. 14 and 15 together, in a first deposition an organic EL materials vapor stream 273 is directed towards the substrate into the deposition zone 272 defined in the mask 270 (see FIG. 13) in a direction substantially perpendicular to the substrate 212 (or in a direction substantially parallel with the center lines 235 and 237 of the shadowing structures 234 and 236) to form the organic EL medium layer 274. In this first-deposition-direction, the shadowing structure 234 and 236 cast a shadow with respect to the vapor stream 273 such that the organic EL medium layer 274 terminates at positions spaced from a base of these shadowing structures. Such spaced positions of the organic EL medium layer 274 are evident at the cathode separation shadowing structure 230 (which includes the shadowing structure 234 and the base layer 238) shown on the left side of FIG. 14, and at the cathode separation shadowing structure 230 and the cathode bus shadowing structure 236 shown in FIG. 15.

In FIG. 14, the cathode bus shadowing structure 236 is seen in the background of this section view which depicts the contact region 280 of electrical contact between the cathode bus metal layer 290 and the cathode connector 220 as described with reference to FIG. 10. The organic EL medium layer 274 extends over the cathode bus metal layer 290 in this view.

In FIG. 15, the cathode bus shadowing structure 236 is sectioned and is formed over the cathode bus metal layer 290 about a center line 237.

Again viewing FIGS. 14 and 15 together, in a second deposition a cathode materials vapor stream 275 is directed towards the just formed EL medium layer 274 into the same deposition zone 272 defined in the mask 270 (see FIG. 13). However, in contrast to the previously described direction of the organic EL materials vapor stream 273, the cathode materials vapor stream 275 subtends an angle Θ with respect to the center lines 235 and 237 of the shadowing structures 234 and 236 to form the cathode(s) 276 as spaced cathodes separated by the cathode separation shadowing structures 230.

With respect to the shadowing structure 234 (forming a cathode separation shadowing structure 230 in conjunction with the electrically insulative base layer 238), the termination of the cathode(s) 276 occurs at positions over the base layer 238, thereby being electrically disconnected from or insulated from other electrically "active" elements of the organic EL device 200.

Since each cathode 276 is in electrical contact at contact regions 286 with a corresponding cathode bus metal layer 290 (also referred to as a cathode bus metal conductor) at each of the plurality of cathode bus shadowing structures 236, a cathode 276 can be formed to be sufficiently thin so as to be light-transmissive, thereby transmitting light emitted from an operative device through the cathode to an observer.

The cathode bus metal conductor (layer 290) permits the cathode thickness to be reduced significantly without incurring the previously described voltage drop associated with a reduced cathode thickness of conventional passive matrix organic EL devices. Furthermore, an unexpected advantage was noted in experimental organic EL devices constructed by the method of the present invention in that a thin cathode reduces leakage currents and substantially eliminates electrically shorted pixels (shorts between a cathode and an anode at a particular pixel location) and pixel-to-pixel crosstalk, compared with a conventional passive matrix organic EL device having a relatively thick cathode.

FIG. 15 depicts a cathode B formed over the organic EL medium layer 274 and in contact with the cathode bus metal layer 290 at contact regions 286 at a location where the organic EL medium layer 274 is spaced from a base of the bus shadowing structure 236. A cathode A is in electrical contact with an adjacent cathode bus metal layer (not shown in FIG. 15; see FIG. 13). Indeed, all cathode terminations occur at locations where the organic EL medium layer is spaced from a base of a shadowing structure by virtue of the subtended-angle second deposition. Stated differently, all cathodes terminate at positions closer to a base of a shadowing structure than the positions of termination of the organic EL medium layer 274, at contact regions 286 as well as over the base layer 238.

Figure 16:
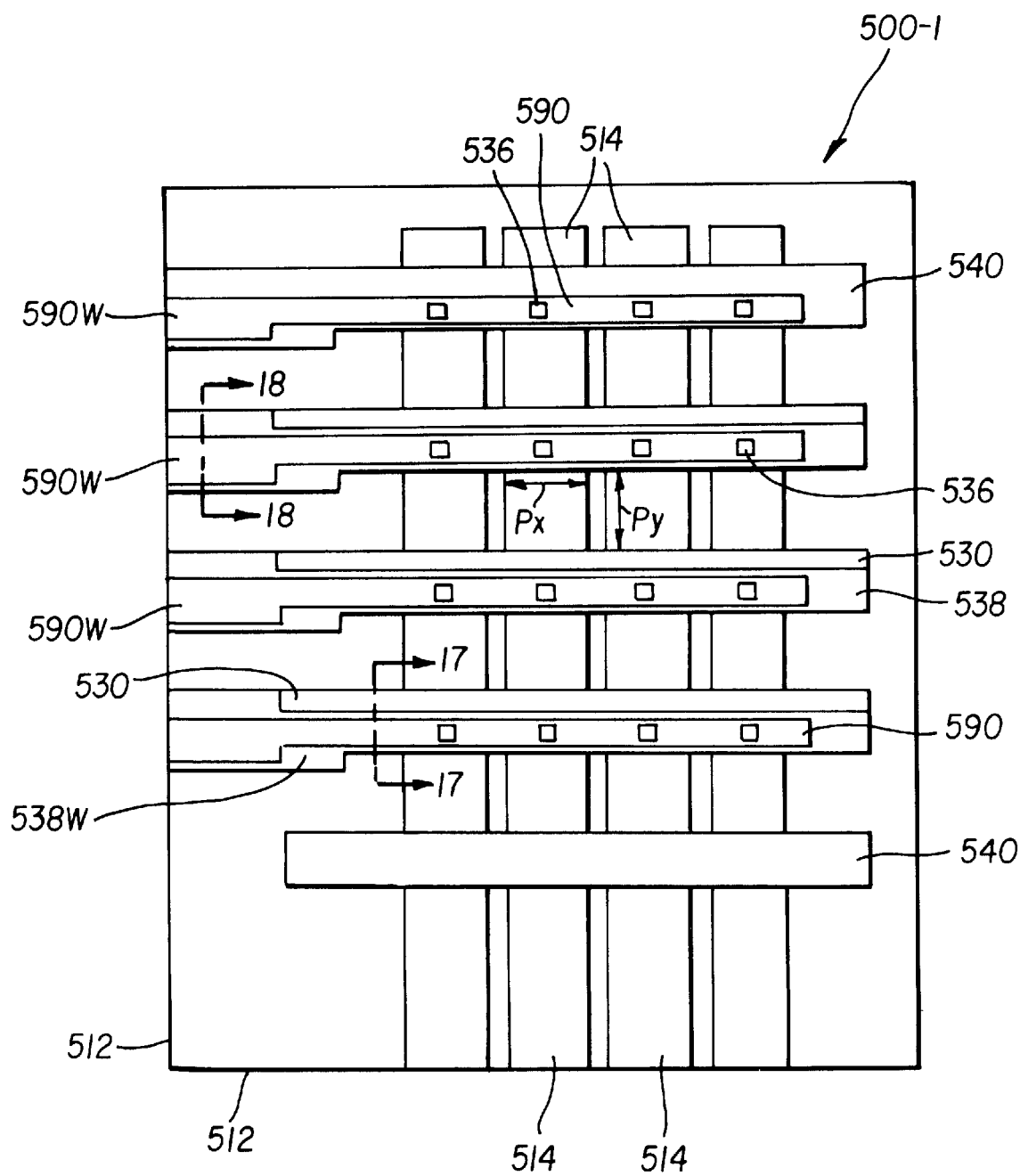

FIG. 16 is a plan view of a substrate configuration 500-1 which differs from the configuration 200-1 of FIG. 8 in the following aspects:

(i) cathode connectors 220 and openings 239 and 249 are eliminated by extending electrically insulative base layer(s) 538 as a widened portion 538W to an edge of the substrate 512, and by extending cathode bus metal layer(s) 590 as a widened portion 590W over a portion of the widened portion 538W and to the edge of the substrate. This widened portion 590W of the cathode bus metal conductor (layer 590) serves as a cathode connector; and (ii) a plurality of square-shaped organic cathode bus shadowing structures 536 are shown as illustrative examples of polygonal shadowing structures.

The substrate 512, the anodes 514, the cathode separation shadowing structures 530, and the lower boundary layer 540 in FIG. 16 correspond to the parts 212, 214, 230, and 240, respectively, of the configuration 200-1 of FIG. 13.

A single mask (not shown in FIG. 16) defining a deposition zone and masking the widened portions 590W of the cathode bus metal layer 590 would be provided in a manner substantially identical to the mask 270 of FIG. 13. And the first and second depositions would be carried out in a manner substantially identical to the deposition sequence described with reference to FIGS. 14 and 15.

Figure 17:
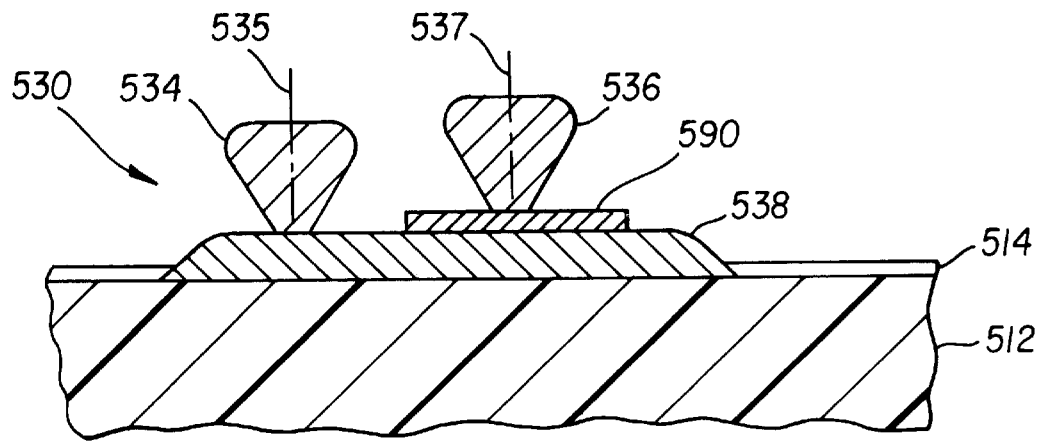
Figure 18:
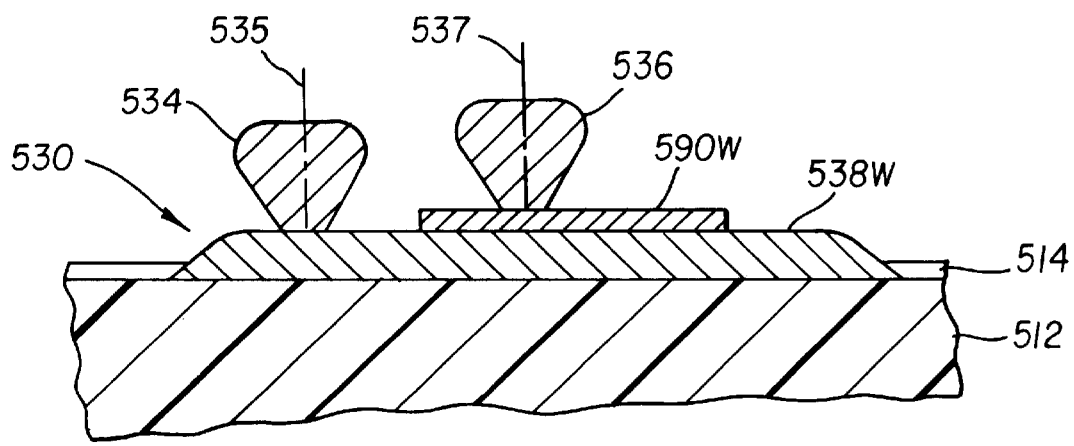

FIGS. 17 and 18 are enlarged section views taken along the section lines 17—17 and 18—18, respectively, of the configuration 500-1 of FIG. 16. The widened portion 538W of the electrically insulative base layer 538, and the widened portion 590W of the cathode bus metal layer 590 can be seen in FIG. 18 when compared to the structures of FIG. 17.

Figure 19:
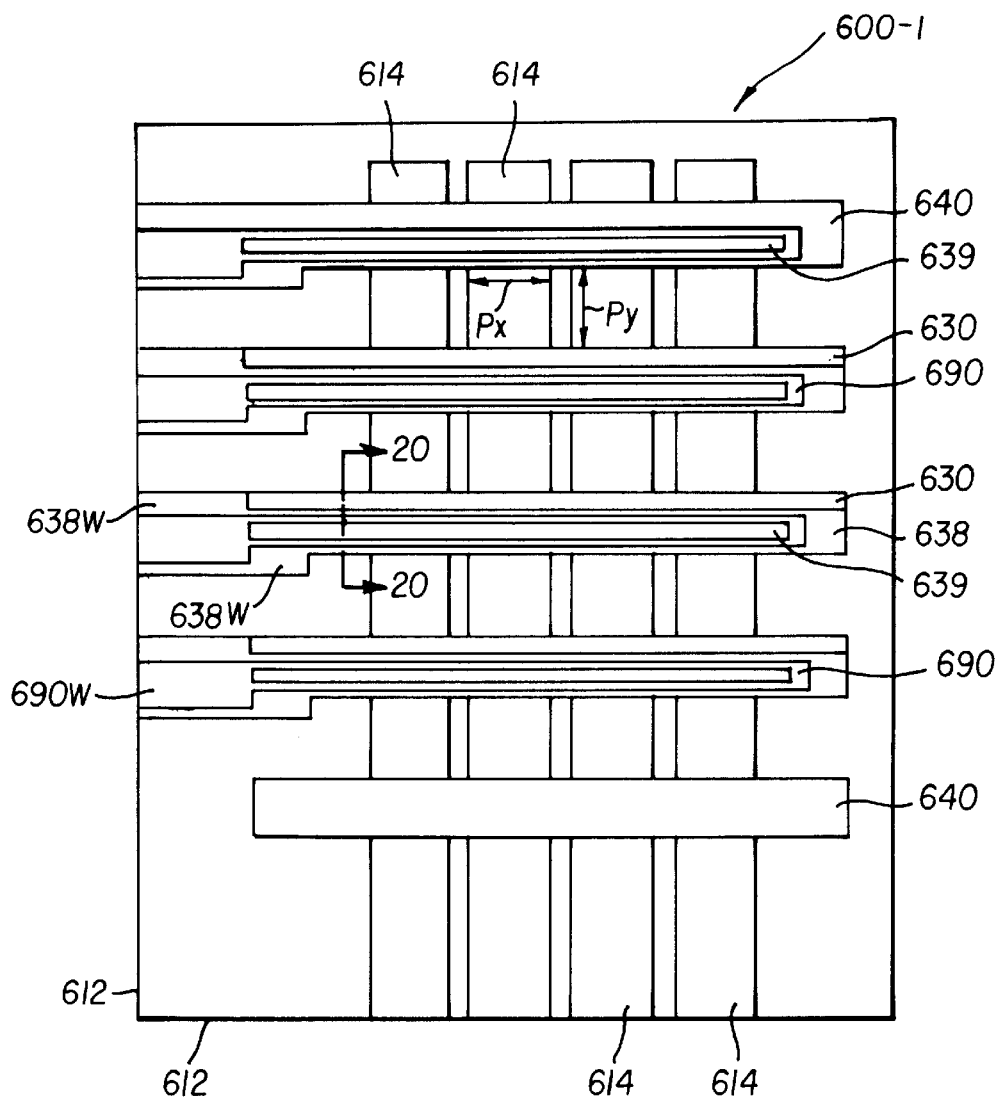

FIG. 19 is a plan view of a configuration of 600-1 prior to deposition of an organic EL medium layer. Here, the substrate 612, the anodes 614, the cathode separation shadowing structures 630, the base layers 638, the cathode bus metal layer 690, as well as the widened portions 638W and 690W correspond to the respective elements 512, 514, 530, 538, 590, 538W, and 590W of the configuration 500-1 of FIG. 16.

A distinguishing feature of the configuration 600-1 is that a single elongated organic cathode bus shadowing structure 639 is formed over each cathode bus metal conductor (layer 690) in place of the plurality of shadowing structures 536 of FIG. 16, and 236 of FIG. 8. This elongated shadowing structure 639 provides continuous electrical contact between a cathode (not shown) and a corresponding cathode bus metal layer 690 throughout a length dimension of the cathode bus shadowing structure following first (organic EL) and second (cathode) depositions into a deposition zone of a mask (not shown) in a manner substantially identical to the description with reference to FIGS. 13, 14, and 15.

This extended or continuous contact region is essentially equivalent to a sum of contact regions 286 (see FIG. 15) along a cathode bus metal layer which would be obtained if the plurality of cathode bus shadowing structures 236 (see FIG. 13) would be increased in number so as to substantially overlap one another. Thus, the extended contact regions provided by the shadowing structures 639 permits forming a still thinner cathode or cathodes and without the adverse effects of a voltage drop along the length dimension of a cathode.

Figure 20:
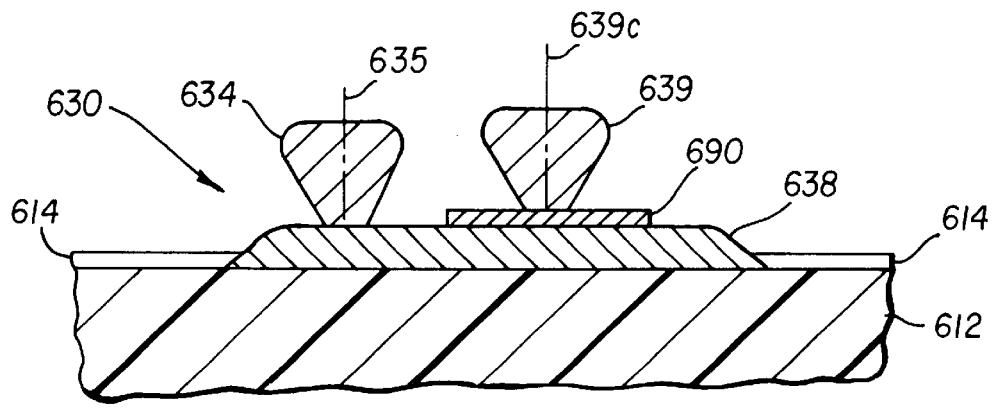

FIG. 20 is an enlarged section view taken along the section line 20—20 of FIG. 19, and is substantially equivalent to FIG. 17 is all aspects, except that the shadowing structure 639 is elongated as seen in the plan view of FIG. 19 and having a center line 639C.

Figure 21:
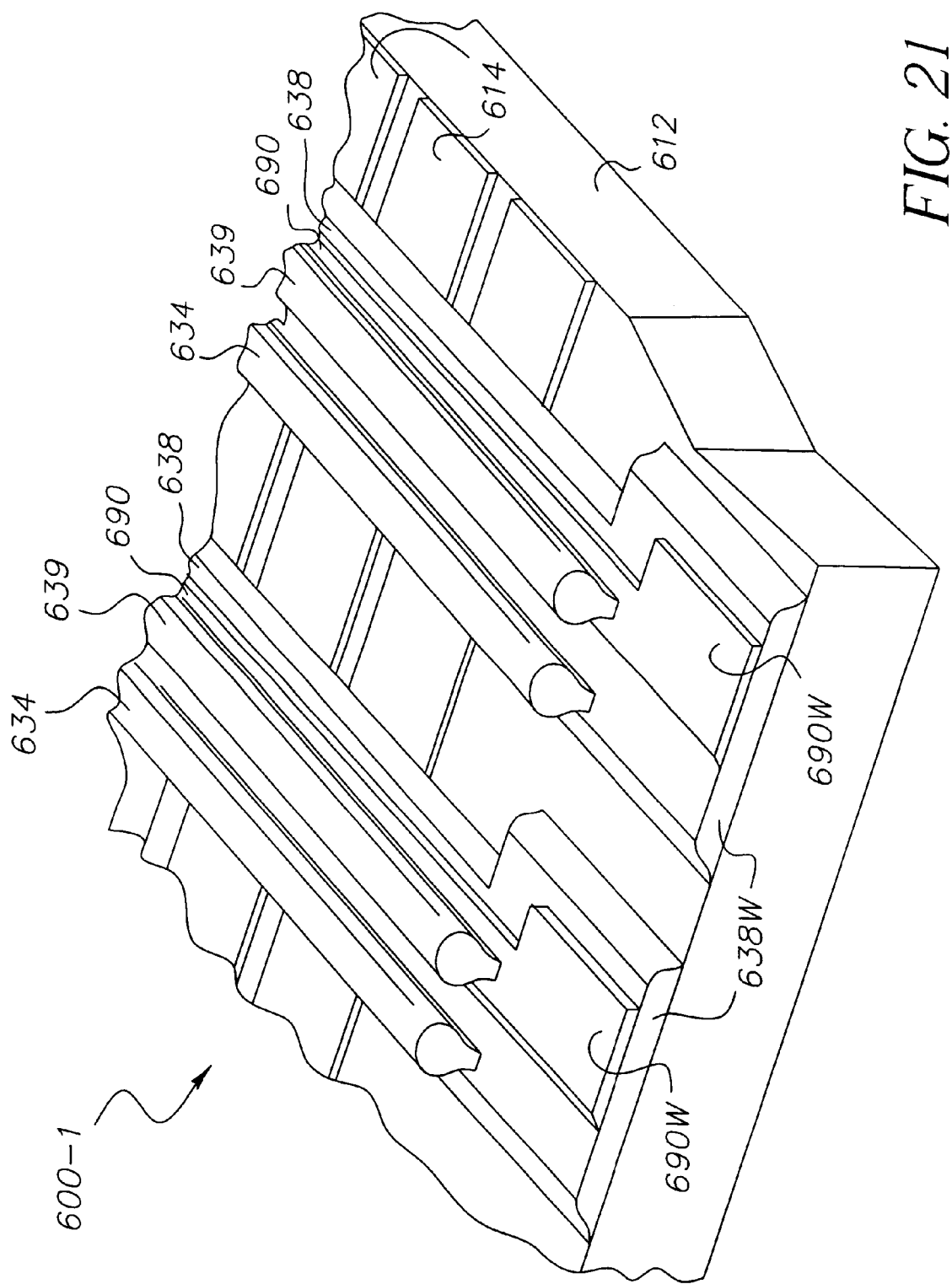

FIG. 21 is a schematic fractional perspective view of the configuration 600-1 of FIG. 19, and showing the widened portions 638W and 690W of the base layer 638 and the cathode bus metal conductor (layer 690), respectively, extending to an edge of the substrate 612. The parallel arrangement and substantially identical termination of the (cathode separation) shadowing structures 634 and the cathode bus shadowing structures 639 is evident.

It will be appreciated that the method of making a passive matrix pixelated organic EL device such as described with reference to FIGS. 8–15 can be used to make an inverted organic EL device having a plurality of spaced cathodes formed on a substrate, electrically insulative base layers and boundary layers formed perpendicularly over the cathodes and the substrate, anode separation shadowing structures, anode bus metal conductors or layers formed over portions of the base layers, anode bus shadowing structures formed over the anode bus metal layers, and anode connectors preferably formed similar to the cathode connectors shown in FIGS. 16 and 19. A first vapor deposition of an organic EL medium layer, and a second vapor deposition of an anode material to form anode(s) over the organic EL medium layer provide an inverted organic EL device. The first and second depositions are directed into a deposition zone defined in a mask, and in respective vapor stream directions as described with reference to FIGS. 14 and 15.

It will be appreciated that the anodes or the cathodes are constructed to be light-transmissive in a non-inverted organic EL device, as well as in an inverted organic EL device. Examples of materials useful for forming light-transmissive anodes include tin oxides, indium-tin-oxides (ITO), chromium cermet materials, and thin layers of metals or metal alloys capable of injecting holes (positive charge carriers) into an organic EL medium layer.

The invention has been described in detail with particular reference to certain preferred embodiments thereof, but it will be understood that variations and modifications can be effected within the spirit and scope of the invention.

Parts List 10 organic electroluminescent (EL) device (prior art)
10-1 configuration before organic EL medium deposition
10-2 configuration after organic EL medium deposition
12 light-transmissive substrate
14 light-transmissive anode(s)
20 cathode connector(s)
24 contact region (between cathode and cathode connector)
30 organic cathode separation shadowing structure(s)
31 center line(s)
32 organic base layer(s)
34 organic shadowing structure(s)
50 mask (for organic EL medium deposition)
52 deposition zone (for organic EL medium deposition)
53 organic EL materials vapor stream
54 organic EL medium layer
60 mask (for cathode deposition)
62 deposition zone (for cathode deposition)
63 cathode materials vapor stream
66 cathode(s)
200 organic electroluminescent.(EL) device
200-1 configuration before organic EL medium deposition
212 substrate
214 anode(s)
220 cathode connector(s)
230 organic cathode separation shadowing structure(s)
234 organic shadowing structure(s)
235 center line(s)

Parts List 236 organic cathode bus shadowing structure
237 center line(s)
238 insulative base layer(s)
239 opening 240 insulative boundary layer(s)
249 opening
270 mask (for organic EL medium and for cathode deposition)
272 deposition zone
273 organic EL materials vapor stream
274 organic EL medium layer
275 cathode materials vapor stream
276 cathode(s)
280 contact region (between cathode bus metal layer and cathode connector)
286 contact region (between cathode and cathode bus metal layer)
290 cathode bus metal layer or conductor
500-1 device configuration before organic EL medium deposition
512 substrate
514 anode(s)
530 organic cathode separation shadowing structure(s)
535 center line(s)
536 organic cathode bus shadowing structure
537 center line(s)
538 insulative base layer(s)
538W widened portion of base layer(s)
540 insulative boundary layer(s)
590 cathode bus metal layer or conductor Parts List 590W widened portion of bus metal layer or conductor
600-1 configuration before organic EL medium deposition
612 substrate
614 anode(s)
630 organic cathode separation shadowing structure(s)
634 organic shadowing structure(s)
635 center line(s)
638 insulative base layer(s)
638W widened portion of base layer(s)
639 elongated organic cathode bus shadowing structure(s)
639c center line(s)
640 insulative boundary layer(s)
690 cathode bus metal layer or conductor
690W widened portion of bus metal layer or conductor
Px active pixel dimension in x-direction
Py active pixel dimension in y-direction
Θ angle (subtended by cathode materials vapor stream)
WB width dimension of base layer
WS width dimension of organic shadowing structure(s)

What is claimed is:

1. A method of making a passive matrix pixelated organic electroluminescent (EL) device having a thin cathode, comprising the steps of a) providing a substrate having a plurality of spaced anodes formed thereon and a plurality of spaced cathode connectors extending inwardly from an edge of the substrate for providing an electrical connection so that a drive voltage can be applied between a selected anode and a selected thin cathode to cause light emission from a pixel of the device formed by the selected anode and the selected cathode;

b) forming a plurality of spaced electrically insulative base layers over the anodes and the substrate which extend in a direction perpendicular to the anodes and over a portion of each of the spaced cathode connectors and forming an opening or a cut-out in the base layers to extend to the cathode connectors in the portion;

c) forming a conductive cathode bus metal layer over a portion of each of the base layers, the bus metal layer extending at least into the opening or cut-out to provide an electrical contact to each of the spaced cathode connectors;

d) forming an electrically insulative organic cathode separation shadowing structure over each of the base layers and forming at least one organic cathode bus shadowing structure over a portion of the cathode bus metal layer;

e) providing a mask defining a deposition zone over the substrate for depositing an organic EL medium layer and a conductive cathode over the organic EL medium layer;

f) first depositing the organic EL medium layer by vapor deposition of organic EL materials directed towards the substrate into the deposition zone and using a direction of vapor deposition of the organic EL materials with respect to the shadowing structures formed in step d) to cause formation of the organic EL medium layer to terminate at positions spaced from a base of each of the shadowing structures; and g) second depositing a conductive thin cathode by a vapor deposition of conductive cathode materials directed towards the organic EL medium layer into the deposition zone and using a direction of vapor deposition of the conductive materials with respect to the shadowing structures formed in step d) to cause formation of a plurality of spaced thin cathodes, each of such spaced cathodes being in electrical contact with a corresponding cathode bus metal layer in the positions where the organic EL medium layer is spaced from the base of the at least one cathode bus shadowing structure.

2. The method of claim 1 wherein the mask is provided as part of a frame structure for accurately positioning the mask with respect to the substrate.

3. The method of claim 1 wherein the direction of vapor deposition of the organic EL materials is substantially perpendicular to a surface of the substrate.

4. The method of claim 3 wherein the direction of vapor deposition of the conductive cathode materials subtends an angle Θ with respect to center lines of the at least one cathode bus shadowing structure and the cathode separation shadowing structures.

5. The method of claim 1 wherein the second depositing step g) includes depositing a thin light-transmissive conductive cathode.

6. A passive matrix pixelated organic electroluminescent (EL) device made by the method of claim 5.

7. The method of claim 1 wherein the step of forming the at least one cathode bus shadowing structure includes forming a plurality of cathode bus shadowing structures spaced along each bus metal layer.

8. A passive matrix pixelated organic electroluminescent (EL) device made by the method of claim 7.

9. A method of making a passive matrix pixelated organic electroluminescent (EL) device having a thin cathode, comprising the steps of a) providing a substrate having a plurality of spaced anodes formed thereon and forming a plurality of spaced electrically insulative base layers over the anodes and the substrate which extend in a direction perpendicular to the anodes and to an edge of the substrate;

b) forming a conductive cathode bus metal layer over a portion of each of the base layers, the bus metal layer extending to the edge of the substrate for providing an electrical connection so that a drive voltage can be applied between a selected anode and a selected thin cathode to cause light emission from a pixel of the device formed by the selected anode and the selected cathode;

c) forming an electrically insulative organic cathode separation shadowing structure over each of the base layers and forming at least one organic cathode bus shadowing structure over a portion of the cathode bus metal layer;

d) providing a mask defining a deposition zone over the substrate for depositing an organic EL medium layer and a conductive cathode over the organic EL medium layer;

e) first depositing the organic EL medium layer by vapor deposition of organic EL materials directed towards the substrate into the deposition zone and using a direction of vapor deposition of the organic EL materials with respect to the shadowing structures formed in step c) to cause formation of the organic EL medium layer to terminate at positions spaced from a base of each of the shadowing structures; and f) second depositing a conductive thin cathode by a vapor deposition of conductive cathode materials directed towards the organic EL medium layer into the deposition zone and using a direction of vapor deposition of the conductive materials with respect to the shadowing structures formed in step c) to cause formation of a plurality of spaced thin cathodes, each of such spaced cathodes being in electrical contact with a corresponding cathode bus metal layer in the positions where the organic EL medium layer is spaced from the base of the at least one cathode bus shadowing structure.

10. The method of claim 9 wherein the mask is provided as part of a frame structure for accurately positioning the mask with respect to the substrate.

11. The method of claim 9 wherein the direction of vapor deposition of the organic EL materials is substantially perpendicular to a surface of the substrate.

12. The method of claim 11 wherein the direction of vapor deposition of the conductive cathode materials subtends an angle Θ with respect to center lines of the at least one cathode bus shadowing structure and the cathode separation shadowing structures.

13. The method of claim 9 wherein the second depositing step f) includes depositing a thin light-transmissive conductive cathode.

14. A passive matrix pixelated organic electroluminescent (EL) device made by the method of claim 13.

15. The method of claim 9 wherein the step of forming the at least one cathode bus shadowing structure includes forming a plurality of cathode bus shadowing structures spaced along each bus metal layer.

16. A passive matrix pixelated organic electroluminescent (EL) device made by t he method of claim 15.

17. The method of claim 1 wherein the step of forming the at least one cathode bus shadowing structure includes forming a circular or a polygonal cathode bus shadowing structure as observed in a plan view of such shadowing structure.

18. The method of claim 7 wherein forming the plurality of cathode bus shadowing structures includes forming circular or polygonal cathode bus shadowing structures as observed in a plan view of such shadowing structures.

19. The method of claim 15 wherein forming the plurality of cathode bus shadowing structures includes forming circular or polygonal cathode bus shadowing structures as observed in a plan view of such shadowing structures.

20. The method of claim 9 wherein forming the plurality of electrically insulative base layers and forming the cathode bus metal layers includes forming a widened base layer portion and a widened bus metal layer portion extending inwardly by a distance from the edge of the substrate.

21. A passive matrix pixelated organic electroluminescent (EL) device made by the method of claim 20.

22. A method of making an inverted passive matrix pixelated organic electroluminescent (EL) device having a light-transmissive anode, comprising the steps of:

a) providing a substrate having a plurality of spaced cathodes formed thereon and forming a plurality of spaced electrically insulative base layers over the cathodes and the substrate which extend in a direction perpendicular to the cathodes and to an edge of the substrate;

b) forming a conductive anode bus metal layer over a portion of each of the base layers, the bus metal layer extending to the edge of the substrate for providing an electrical connection so that a drive voltage can be applied between a selected cathode and a selected light-transmissive anode to cause light emission from a pixel of the device formed by the selected cathode and the selected anode;

c) forming an electrically insulative organic anode separation shadowing structure over each of the base layers and forming at least one organic anode bus shadowing structure over a portion of the anode bus metal layer;

d) providing a mask defining a deposition zone over the substrate for depositing an organic EL medium layer and a conductive light-transmissive anode over the organic EL medium layer;

e) first depositing the organic EL medium layer by vapor deposition of organic EL materials directed towards the substrate into the deposition zone and using a direction of vapor deposition of the organic EL materials with respect to the shadowing structures formed in step c) to cause formation of the organic EL medium layer to terminate at positions spaced from a base of each of the shadowing structures; and f) second depositing a conductive light-transmissive anode by a vapor deposition of conductive anode materials directed towards the organic EL medium layer into the deposition zone and using a direction of vapor deposition of the conductive materials with respect to the shadowing structures formed in step c) to cause formation of a plurality of spaced light-transmissive anodes, each of such spaced anodes being in electrical contact with a corresponding anode bus metal layer in the positions where the organic EL medium layer is spaced from the base of the at least one anode bus shadowing structure.

23. An inverted passive matrix pixelated organic electroluminescent (EL) device made by the method of claim 22.

24. The organic EL device of claim 6 wherein the anodes are provided of a material capable of injecting positive charge carriers into the organic EL medium layer and the cathodes are formed of a material capable of injecting negative charge carriers into the organic EL medium layer.

25. The organic EL device of claim 14 wherein the anodes are provided of a material capable of injecting positive charge carriers into the organic EL medium layer and the cathodes are formed of a material capable of injecting negative charge carriers into the organic EL medium layer.

26. The organic El device of claim 21 wherein the anodes are provided of a material capable of injecting positive charge carriers into the organic EL medium layer and the cathodes are formed of a material capable of injecting negative charge carriers into the organic EL medium layer.

27. The inverted organic EL device of claim 23 wherein the cathodes are provided of a material capable of injecting negative charge carriers into the organic EL medium layer and the anodes are formed of a material capable of injecting positive charge carriers into the organic EL medium layer.

* * * * *